United States Patent
Isaacs et al.

[11] 3,977,770
[45] Aug. 31, 1976

[54] $Tl_3VS_4$, $Tl_3NbS_4$ CRYSTALS AND ACOUSTO-OPTICAL DEVICES

[75] Inventors: Thelma J. Isaacs, Monroeville; Milton S. Gottlieb, Pittsburgh; John D. Feichtner, Murrysville; Andrea A. Price, Pittsburgh, all of Pa.

[73] Assignee: Westinghouse Electric Corporation, Pittsburgh, Pa.

[22] Filed: Sept. 22, 1975

[21] Appl. No.: 615,639

Related U.S. Application Data

[62] Division of Ser. No. 392,695, Aug. 29, 1973, Pat. No. 3,929,976.

[52] U.S. Cl. .......................... 350/161; 331/94.5 M; 350/320; 333/30 R; 252/62.9
[51] Int. Cl.² ..................... G02F 1/11; H03H 9/30; H01L 41/08
[58] Field of Search .......... 350/161, 320; 333/30 R; 423/511; 331/94.5; 252/62.9

[56] References Cited
UNITED STATES PATENTS

| | | | |
|---|---|---|---|
| 3,746,866 | 7/1973 | Feichtner | 350/161 Y |
| 3,799,659 | 3/1974 | Roland et al. | 350/161 X |
| 3,915,556 | 10/1975 | Roland et al. | 350/161 |
| 3,929,970 | 12/1975 | Isaacs | 350/161 X |
| 3,929,976 | 12/1975 | Isaacs et al. | 423/511 |
| 3,931,595 | 1/1976 | Isaacs et al. | 350/161 X |

OTHER PUBLICATIONS

Antipova et al., "Chem. Abstracts," vol. 78, 1973 103207n.

*Primary Examiner*—Jack Cooper
*Attorney, Agent, or Firm*—R. D. Fuerle

[57] ABSTRACT

Single crystals of $Tl_3VS_4$ and $Tl_3NbS_4$ are disclosed which have useful acousto-optical properties, including low acoustic velocities and high acousto-optical figure of merit. They are used in acousto-optical devices such as a display device, a laser modulator, a non-collinear tunable filter, and an acousto-optical delay line.

19 Claims, 5 Drawing Figures

Tl₃VS₄·TL₃NbS₄ CRYSTALS AND ACOUSTO-OPTICAL DEVICES

CROSS-REFERENCE TO RELATED APPLICATIONS

This is a division of application Ser. No. 392,695 filed Aug. 29, 1973, now U.S. Pat. No. 3,929,976.

This application is related to application Ser. No. 242,986, filed Apr. 11, 1972 entitled "Tl₃AsS₄ Crsytals and Acousto-Optical Systems," now U.S. Pat. No. 3,799,659.

This application is related to application Ser. No. 540,194, filed Jan. 10, 1975, by R. W. Weinert and T. J. Isaacs, titled "Crystals Having Zero Temperature Coefficients of Delay."

BACKGROUND OF THE INVENTION

In 1932 Brillouin discovered that high frequency sound waves can cause diffraction of light. Due to the development of the laser and advances in high frequency acoustic techniques, many applications for these phenomena have been found such as display devices, laser modulators, tunable filters, and acoustic delay lines.

A sound wave in a medium produces alternating compression and rarefaction fronts. The index of refraction in these fronts is different, so that the crystal acts as a diffraction grating, diffracting light which passes through it, the angle of diffraction increasing as the frequency of the sound waves increases, and the amount of light diffracted increasing with the intensity of the sound wave.

There are two modes of diffraction, the Debye-Sears mode and the Bragg mode. The Debye-Sears mode is obtained if the width of the acoustic beam is less than about $\Lambda^2/(4\lambda)$ and the Bragg mode is obtained if the width of the acoustic beam is greater than about $\Lambda^2/4\lambda$ where $\Lambda$ is the acoustic wavelength and $\lambda$ is the light wavelength. In both modes the acoustic wavelength $\Lambda$ must be greater than the light wavelength $\lambda$, and $\lambda$ must, of course, be within the transparency region of the crystal. In the Debye-Sears mode light enters the crystal parallel to the acoustic wave fronts (0° diffracting angle) and is multiply-diffracted into many images or orders of the initial light beam. In the Bragg mode light enters the crystal at the Bragg Angle $\phi$ to the acoustic wave fronts where $\sin \phi = \lambda/\Lambda$. In this mode the acoustic wavelength and the Bragg angle are matched to the particular light wavelength, and a single image is diffracted from the crystal at the Bragg angle $\phi$ to the acoustic wave fronts.

A good acousto-optical material should have a high figure of merit $M_2$, a measure of the amount of light diffracted for a given amount of acoustic power, where $M_2 = n^6 p^2 / \rho v^3$ and $n$ is the refractive index, $p$ is the photoelastic coefficient, $\rho$ is the density, and $v$ is the acoustic velocity. As the formula indicates, a low velocity will give a high figure of merit. Also, a low velocity will give a greater delay per unit length if the crystal is used in a delay line thus permitting acoustic signal processing devices to have smaller physical dimensions. A good acousto-optical material should also have a low acoustic attenuation, allowing a high frequency wave to propagate a long distance before it is absorbed.

The following table gives a few of the properties of the best acousto-optical materials currently known for use in the near infrared region of the spectrum:

| Material | Optical Range (μm) | Acoustic Velocity (×10⁵ cm/sec) | Acousto-Optical Figure of Merit M₂ |
|---|---|---|---|
| Ge | 2–20 | 5.5 | 525 |
| As₂S₃ glass | 0.9–11 | 2.6 | 230 |
| GaAs | 1–11 | 5.15 | 93 |
| Tl₃AsS₄ | 0.6–12 | 2.15 | 330 |
| PbMoO₄ | 0.4–5.5 | 3.83 | 24 |

PRIOR ART

An article entitled "Some Ternary Thallium Chalcogenides" by C. Crevecoeur appears in the January—June 1964 volume (Volume No. 17) of Acta Crystallographica on page 757. That article describes the preparation and characteristics of the isomorphous compounds Tl₃VS₄, Tl₃NbS₄, Tl₃TaS₄, Tl₃VSe₄, Tl₃NbSe₄, and Tl₃TaSe₄. Large, single crystals were not prepared and non-linear and acousto-optical properties are not mentioned.

SUMMARY OF THE INVENTION

We have found that large single crystals can be grown of Tl₃VS₄ and Tl₃NbS₄. We have also found that these crystals possess excellent acousto-optical properties and can be used in various acousto-optical devices.

DESCRIPTION OF THE INVENTION

PREPARATION OF COMPOUND AND CRYSTAL

Figure 1:
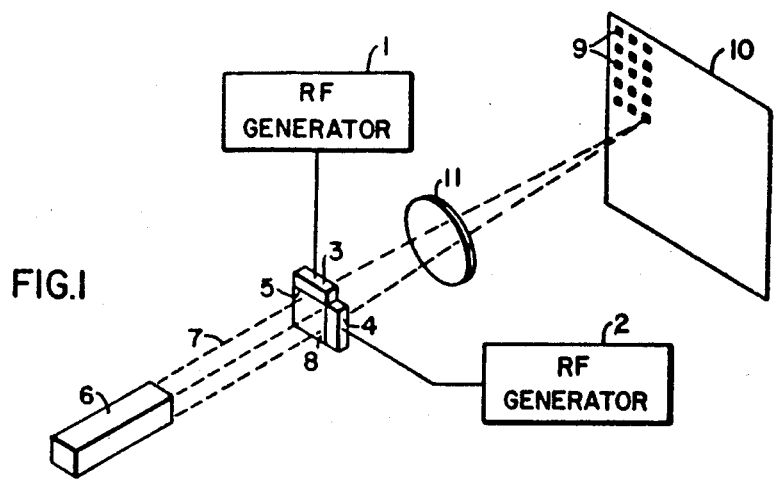
FIG. 1 is an isometric diagrammatic drawing of a display device.

The compounds of this invention may be prepared by mixing and melting together very pure stoichiometric quantities of the elements involved until they react to form the compound. Several days of heating the melt may be required. The temperature of the melt must be maintained considerably above the melting point (e.g., 1000°C) in order for a complete reaction to occur within a reasonable period of time (e.g., a few days).

A crystal may be prepared by the Stockbarger technique in which the compound is sealed in a quartz tube under argon, melted, and lowered very slowly (10 to 15 mm/day) through a two-zone furnace having a steep temperature gradient (8 to 12°C/mm) at the melting point of the compound, about 515° ± 2°C for Tl₃VS₄. The crystals may be made slightly non-stoichiometric in order to relieve internal stresses. Non-conducting mixtures of the two crystals are also contemplated (e.g., $Tl_3V_{.3}Nb_{.7}S_4$) where "conducting" means having a resistivity less than $10^5$ Ω-cm.

THE CRYSTAL

The crystals of this invention are isotropic, piezoelectric, and cubic. They have the CsCl structure, $I\bar{4}3m$, with two formula units per unit cell, and their diffraction aspect derived from X-ray data is I***.

The length of the axes of the $Tl_3VS_4$ crystal is about 7.497 ± 0.004A and its transparency region is about 0.78 to about 10μm. The measured refractive indices of the $Tl_3VS_4$ crystal are 3.08 at 0.825 μm, 2.95 at 1.06 μm and 2.93 at 1.15 μm. The acoustic velocity of $Tl_3VS_4$ is $2.5 \times 10^5$ cm/sec for longitudinal waves, $9 \times 10^4$ cm/sec for the slow shear wave, and $1.7 \times 10^5$ cm/sec for the fast shear wave. The acousto-optical figure of merit of $Tl_3VS_4$ (measured relative to fused quartz) is about 750 with both longitudinal and shear waves at an optical wavelength of 1.15 μm.

The crystals of this invention also display nonlinear properties which may be of use in certain devices not requring phase-matching.

The crystals should be as long as possible in order to maximize the output power but if the crystal is too thick (i.e., more than about 10 cm.) light loss due to absorption will be high. On the other hand, the crystal should not be too thin in the direction of light propagation as this will result in poor interaction between the light and sound, but a crystal as small as 1 mm. long can be optically useful. Also, from the point of view of crystal fabrication, sizes of at least 1 mm. are required, since it is very difficult to orient, cut and polish crystals much smaller than this, and to bond transducers to them. The width of the crystal should be at least as wide as the input beam can be focused, about $10^{-3}$ cm., so that light is not wasted. For acousto-optical applications the crystal must be large enough to produce a Bragg interaction between sound and light. That requires at least ten acoustic wave fronts which means a minimum length of $3 \times 10^{-2}$ mm. is required at an acoustic frequency of 300 MHz.

Preferably the crystal should be at least about ½ cm. in diameter and about 1 cm. long to have practical usefulness in most acousto-optical devices. The crystal also preferably has at least two polished parallel optical faces, which preferably are perpendicular to the direction of propagation of pure shear or pure longitudinal modes in the crystal. That direction is preferably along an axis.

THE SOUND WAVES

The sound wave may be a longitudinal wave, where the particle motion is in the direction of propagation of the wave, or it may be a shear wave, where the particle motion is perpendicular to the propagation direction of the wave, or it may be a combination of both. Preferably, it is either pure shear or pure longitudinal because the two waves travel at different velocities and quickly become out of phase. For delay line applications shear waves are desirable because of their lower velocity. Pure shear waves are obtained by propagating the wave in a pure shear direction (determined by the symmetry of the crystal) using a shear wave generating transducer such as Y cut or A-C cut quartz, which is glued to the crystal. Longitudinal waves are obtained by propagating the wave along the c-axis of another pure longitudinal direction using a longitudinal wave generating transducer such as X-cut quartz which is glued to the crystal.

DISPLAY DEVICES

In a display device a light beam is directed at the crystal and the deflected beam which leaves the crystal is directed at some type of viewing screen.

In FIG. 1 RF generators 1 and 2 send RF signals to transducers 3 and 4 respectively which respectively generate vertically moving and horizontally moving sound waves in crystal 5, preferably in the Bragg mode so that there is only one diffracted beam. The light, which is preferably collimated and polarized, is obtained from laser 6 which generates a coherent beam of light 7 directed at one of the two parallel optical faces 8 of crystal 5. Light passing through crystal 5 is directed at various spots 9 on viewing screen 10 by means of the vertically and horizontally moving sound waves generated by transducers 3 and 4. Lens 11 focuses the light at the spot.

The illuminated spots may each be a page of information which is then optically enlarged and projected on a second viewing screen (not shown). The illuminated spots could also in themselves form a pattern. For example, viewing screen 10 could be an infrared-sensitive phosphor coated screen such as zinc sulfide doped with lead and copper and flooded with UV light and the successive illumination of selected spots would form a picture similar to a TV picture. Or, viewing screen 10 could be an infrared or thermally-quenched UV-excited phosphor screen where ultraviolet light causes the entire screen to be illuminated, but each selected spot successively struck by the beam from crystal 5 is darkened to form a picture on the screen.

LASER MODULATOR

In a laser modulator the acousto-optical system modulates a portion of the output of the lasing medium. If the light is focused to less than about $10^{-2}$ or $10^{-3}$ cm. it will be modulated but not diffracted. For greater diameter focal spots it will be both diffracted and modulated. A laser modulator could be used, for example, to send signals by means of the fluctuating laser beam intensity.

Figure 2:
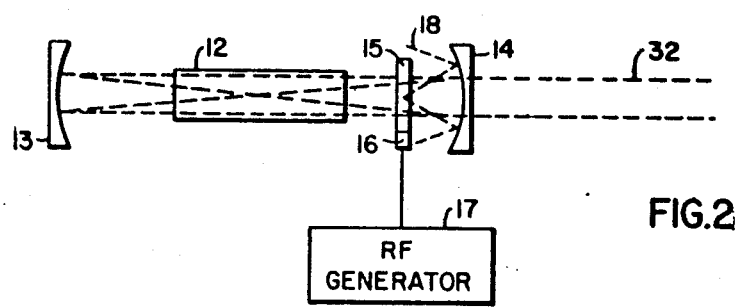
FIG. 2 is a diagrammatic drawing of a laser modulator of the internal configuration.

FIG. 2 shows a laser modulator of the internal configuration. In FIG. 2, lasing medium 12 produces a beam of coherent light which is multiply-reflected between mirrors 13 and 14. Mirror 13 totally reflects the light and mirror 14 partially reflects it and partially transmits it as the laser output 32. Interposed between lasing medium 39 and mirror 14 is crystal 15. (The crystal could also be positioned between mirror 13 and the lasing medium.) To crystal 15 is affixed a transducer 18 which is electrically connected to RF generator 12. This generator produces a radio-frequency electrical signal which transducer 16 converts into an acoustic wave which moves through crystal 43 diffracting light as shown at 18.

Figure 3:
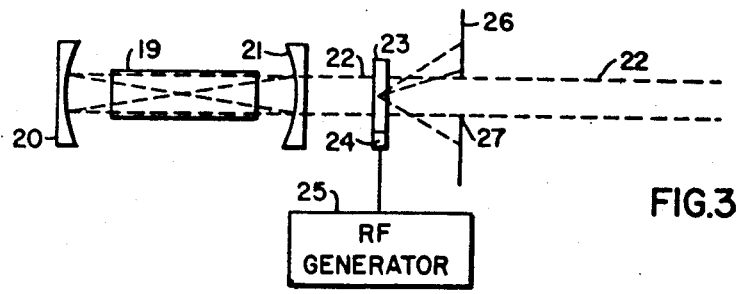
FIG. 3 is a diagrammatic drawing of a laser modulator of the external configuration.

FIG. 3 shows a laser modulator of the external configuration. In FIG. 3 lasing medium 19 produces a beam of coherent light which is multiply-reflected between mirror 20, which totally reflects the beam, and mirror 21 which partially reflects the beam and partially transmits it as laser output 22. The laser output 22 strikes crystal 23 to which is affixed transducer 24 electrically connected to RF generator 25. Generating a sound wave in the crystal diffracts the laser output causing it to strike screen 25 instead of passing through aperture 27 in the screen.

ACOUSTIC DELAY LINE

An acoustic delay line causes an electrical signal to be delayed for the length of time required for an acoustic signal to traverse the crystal, L/V, where L is the length of the crystal and V is the acoustic velocity. Unlike many other methods of delaying an electrical signal, an acoustic delay line preserves the original configuration of the signal.

Figure 4:
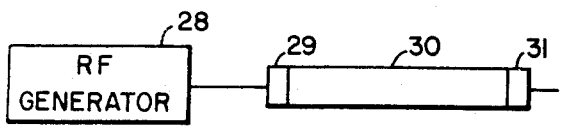
FIG. 4 is a diagrammatic drawing of an acoustic delay line.
Figure 5:
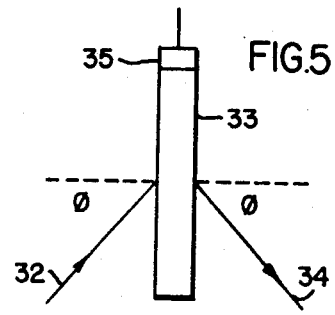
FIG. 5 is a diagrammatic drawing of a non-collinear acousto-optical filter.

In FIG. 4, RF generator 28 provides the electrical signal to be delayed. This signal is electrically transmitted to transducer 29 which converts the signal to an acoustic wave which is propagated through crystal 30. At the other end of the crystal transducer 31 detects the acoustic wave and converts it into an electrical signal.

NON-COLLINEAR FILTER

In a non-collinear filter, the incident light 32 strikes the crystal 33 at a fixed angle, $\phi$. Only light of wavelength $\lambda$, which satisfies the condition $$\lambda = (v/f) \sin \phi$$

will be diffracted at the angle $\phi$ into the output beam 34; $f$ is the frequency applied to the transducer 35. Light of any other wavelength passes through the crystal undeflected. Any wavelength of light may be selected for deflection by choosing the appropriate frequency.

EXAMPLE I

A reaction vessel was charged with 6.1311 grams thallium, 0.4839 grams vanadium, and 1.2826 grams sulfur, sealed under vacuum, and heated at about 1000°C for 2 days. The liquid mixture was shaken vigorously while at that temperature to ensure homogeneity and to completely react the elements to form the compound $Tl_3V_{0.95}S_4$.

The liquid was placed in a fused quartz crystal growing tube 0.8 cm. in diameter and covered with argon at a pressure of 15 inches. Using the Stockbarger technique a crystal of $Tl_3V_{0.95}S_4$ was grown at a rate of 13.8 mm/day. The crystal was orientated and cut with the faces perpendicular to the axes. The cut crystal was a cube 0.6 cm. on a side.

EXAMPLE II

A reaction vessel was charged with 13.7951 grams thallium, 1.1461 grams vanadium, and 2.8859 grams sulfur. The vessel was sealed under vacuum and then was heated at 1000°C for 3 days to react the elements and form the compound $Tl_3VS_4$. The procedure of Example I was repeated except that the crystal growth rate was 12 mm/day. The $Tl_3VS_4$ crystal was cut perpendicular to the axes to form a cube 0.6 cm. on a side and a dodecahedron 0.7 cm. by 0.7 cm. long.

EXAMPLE III

The acoustic properties of the $Tl_3VS_4$ crystals prepared in the previous examples were measured using polished crystals cut about 10 mm. × 5 mm. × 4 mm. Quartz transducers were cemented onto opposite sides of the crystals, and the acoustic velocity was measured by the standard pulse echo technique. The measured velocities were $2.5 \times 10^5$ cm/sec. for longitudinal waves, $9 \times 10^4$ cm/sec. for the slow shear wave, and $1.7 \times 10^5$ cm/sec. for the fast shear wave.

The opto-acoustic figure of merit was measured by acoustically bonding the crystals onto a fused quartz buffer rod, so that an acoustic pulse could be transmitted from the quartz to the crystals. By measuring the light diffracted by the pulse in the quartz and in the crystals, the figure of merit of the crystals relative to that of quartz was determined. The relative figure of merit was up to 750, with both shear and longitudinal waves, at an optical wavelength of 1.15 $\mu$m. Since there is little change in the refractive index for longer wavelengths, the figure of merit should also not change a great deal for longer wavelengths.

We claim:
1. A method of diffracting light comprising passing said light through two parallel optical faces of a a single crystal selected from the group consisting of $Tl_3VS_4$, $Tl_3NbS_4$, and non-conducting mixtures thereof, while generating a sound wave at a diffracting angle to said light in said single crystal said light being in the transparency range of said crystal and said crystal being at least about $10^{-3}$ cm. wide and 1 mm. long.

2. A method according to claim 1 where two sound waves are generated perpendicular to each other, and including the last step of directing said diffracted light at a viewing screen.

3. A method according to claim 2 wherein said sound waves are in the Bragg mode.

4. A method according to claim 2 wherein said light is polarized and coherent.

5. A method according to claim 1 wherein the source of said light is a laser which comprises a lasing medium positioned between two opposing mirrors, one partially reflecting and the other totally reflecting.

6. A method according to claim 5 wherein said single crystal is positioned external to said laser.

7. A method according to claim 5 wherein said single crystal is positioned between said lasing medium and one of said mirrors.

8. A method according to claim 1 wherein said crystal is at least about ½ cm in diameter and about 1 cm long.

9. A method according to claim 1 wherein said single crystal is a rectangle, said sound waves move the length of said rectangle, and said light wave is incident to the face of said rectangle at a non-normal angle.

10. An acousto-optical system comprising:
 1. a single crystal selected from the group consisting of $Tl_3VS_4$, $Tl_3NbS_4$, and non-conducting mixtures thereof said single crystal being at least about $10^{-3}$cm. wide and 1 mm long and having two parallel optical faces.
 2. means for passing light through said crystal;
 3. means for generating a sound wave at a diffracting angle to said light in said crystal; and
 4. means for detecting said light after it passes through said crystal.

11. An acousto-optical system according to claim 10 including means for generating a second sound wave perpendicular to the first sound wave, and including a viewing screen which is irradiated by said diffracted light.

12. An acousto-optical system according to claim 11 wherein said sound waves are in the Bragg mode.

13. An acousto-optical system according to claim 11 wherein said light is polarized and coherent.

14. An acousto-optical system according to claim 10 wherein the source of said light is a laser which comprises a lasing medium positioned between two opposing mirrors, one partially reflecting and the other totally reflecting.

15. An acousto-optical system according claim 14 wherein said single crystal is positioned external to said laser.

16. An acousto-optical system according to claim 14 wherein said single crystal is positioned between said lasing medium and one of said mirrors.

17. An acousto-optical system according to claim 10 wherein said single crystal is a rectangle, said sound waves move the length of said rectangle, and said light wave is incident to the face of said rectangle at a non-normal angle.

18. An acousto-optical system according to claim 10 wherein said single crystal is at least about ½ cm in diameter and about 1 cm long.

19. An acoustic delay line comprising:
1. a single crystal selected from the group consisting of $Tl_3VS_4$, $Tl_3NbS_4$, and non-conducting mixtures thereof;
2. means for generating a sound wave in said crystal; and
3. means for detecting said sound wave after it has traversed said crystal.

* * * * *